US006657280B1

United States Patent
Hulvey et al.

(10) Patent No.: US 6,657,280 B1
(45) Date of Patent: Dec. 2, 2003

(54) REDUNDANT INTERCONNECT HIGH CURRENT BIPOLAR DEVICE

(75) Inventors: Michael D. Hulvey, Shelburne, VT (US); Stephen A. St. Onge, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 09/711,726

(22) Filed: Nov. 13, 2000

(51) Int. Cl.[7] ............... H01L 27/082; H01L 27/102; H01L 29/70
(52) U.S. Cl. ............... 257/578; 257/587; 257/592
(58) Field of Search ............... 257/565, 578, 257/579, 587, 591, 592

(56) References Cited

U.S. PATENT DOCUMENTS

| H842 H | 11/1990 | Ochs ................... 257/690 |
|---|---|---|
| 5,508,552 A | 4/1996 | Iranmanesh et al. ........ 257/571 |
| 5,519,241 A | 5/1996 | Oppermann et al. ........ 257/327 |
| 5,523,614 A * | 6/1996 | Hashimoto ................ 257/578 |
| 5,637,901 A * | 6/1997 | Beigel et al. ............ 257/565 |
| 5,850,101 A * | 12/1998 | Iranmanesh ............... 257/565 |
| 6,020,636 A | 2/2000 | Adishian ................. 257/728 |

FOREIGN PATENT DOCUMENTS

JP 54-128292 * 10/1979 ................ 257/578

* cited by examiner

Primary Examiner—Steven Loke
(74) Attorney, Agent, or Firm—Schmeiser, Olsen & Watts; Mark F. Chadurjian

(57) ABSTRACT

A bipolar transistor having a base contact surrounded by an emitter contact. A plurality of wires extending from the base contact and the emitter contact of the bipolar transistor, wherein the wires of the base contact are stacked higher than the wires of the emitter contact. A device comprising a plurality of these bipolar transistors, wherein at least one side of each emitter contact abuts each adjacent transistor. Increasing the wiring stack of each row of transistors in the device as the distance between the row and the current input increases.

17 Claims, 4 Drawing Sheets

REDUNDANT INTERCONNECT HIGH CURRENT BIPOLAR DEVICE

BACKGROUND OF THE INVENTION

1. Technical Field

The present invention relates generally to integrated circuits, and more particularly, to a bipolar transistor having the capacity to accommodate higher current while maintaining a small foot print.

2. Related Art

In order to increase the current capacity of a bipolar NPN transistor, the size of the emitter contact is increased. However, conventional methods of increasing the size of the emitter contact also result in an increased device foot print, or overall size. As the trend toward smaller and smaller devices continues in the industry, it is desirable to produce a bipolar NPN transistor having an increased current capacity while maintaining a small foot print.

SUMMARY OF THE INVENTION

A first general aspect of the present invention provides a bipolar transistor, comprising: a base; a base contact formed within the base; and an emitter contact formed within the base, wherein the emitter contact surrounds the base contact.

A second general aspect of the present invention provides a device, comprising: a base; a base contact formed within the base; and an emitter contact formed within the base, wherein the emitter contact extends around at least two sides of the base contact.

A third general aspect of the present invention provides a bipolar transistor, comprising: a base; an emitter contact formed within the base; a base contact formed within the base; and a first wiring stack formed atop the emitter contact and a second wiring stack formed atop the base contact, wherein the second wiring stack includes at least one more wiring level than the first wiring stack.

A fourth general aspect of the present invention provides a device, comprising: at least two bipolar transistors, wherein each bipolar transistor further comprises: a base contact; an emitter contact surrounding the base contact; and wherein at least one side of the emitter contact of the at least two bipolar transistors are in electrical contact.

A fifth general aspect of the present invention provides a device, comprising: at least two bipolar transistors, wherein the bipolar transistors are electrically connected to one another, and wherein a first bipolar transistor has a first wiring stack and a second bipolar transistor has a second wiring stack, wherein the second wiring stack comprises at least one more wiring level than the first wiring stack.

The foregoing and other features of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein.

DESCRIPTION OF THE PREFERRED EMBODIMENTS

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1A:
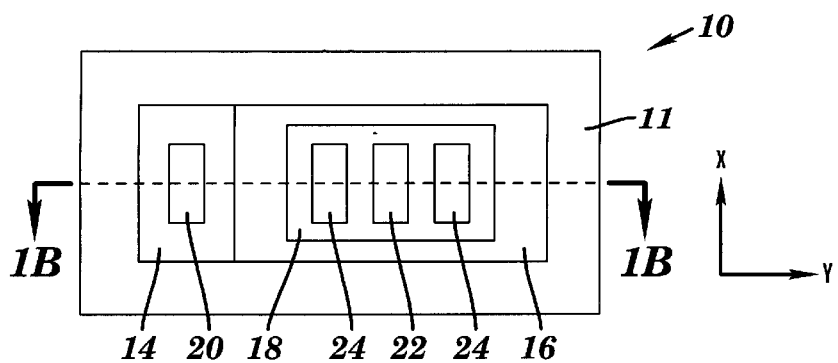
FIG. 1A depicts a top view of a related art bipolar NPN transistor.
Figure 1B:
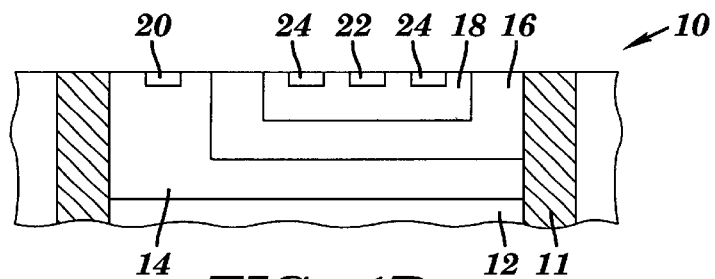
FIG. 1B depicts a cross-sectional view of the related art bipolar NPN transistor of FIG. 1A.

Referring to the drawings, FIG. 1A shows a top view of a related art bipolar NPN transistor 10. FIG. 1B shows a cross-sectional view of the transistor 10 of FIG. 1A taken along line 1B. In the alternative, the transistor may be a PNP transistor, or other similar device. The transistor 10 comprises an isolation trench 11, a P+ substrate 12, an N+ subcollector 14, an N− collector 16 and a P+ base 18. The transistor 10 further includes a collector contact 20 formed within the N+ subcollector 14. Within the P+ base 18, an emitter contact 22 and a pair of base contacts 24 are formed.

In order to increase the amount of current the transistor 10 can safely accommodate, the emitter contact 22 is typically lengthened in the direction of the x-axis. However, lengthening the emitter contact 22 necessitates the enlargement of the base 18, and the entire transistor 10, which in turn adds parasitic capacitance to the various nodes of the device. This tends to slow the functioning of the overall device because the device now has to drive a higher base-collector capacitance, collector-substrate capacitance, and so on.

Figure 2A:
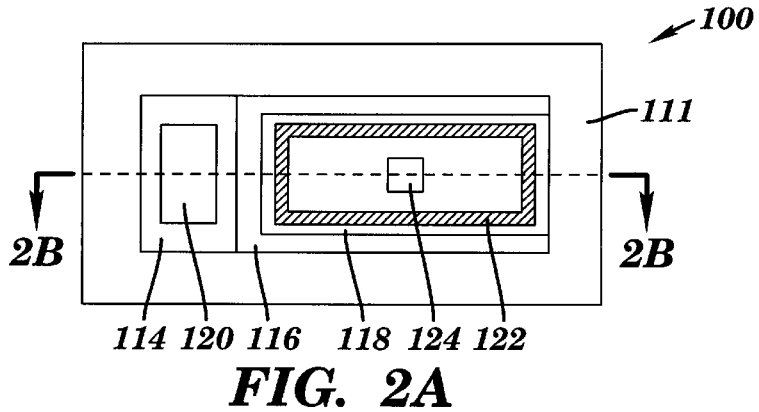
FIG. 2A depicts a top view of a bipolar NPN transistor in accordance with a first embodiment of the present invention.
Figure 2B:
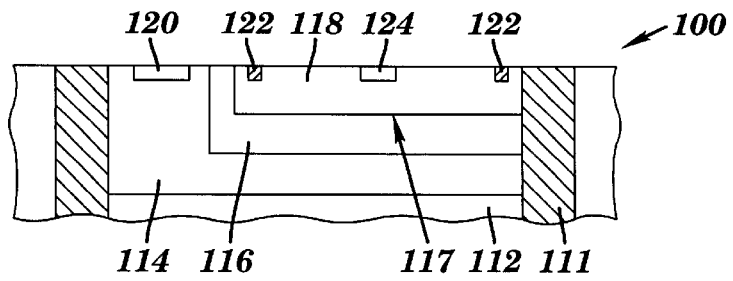
FIG. 2B depicts a cross-sectional view of the transistor of FIG. 2A in accordance with a first embodiment of the present invention.

Therefore, it is desirable to increase the size of the emitter contact, while maintaining a small overall device size. Accordingly, a first embodiment of the present invention provides a device or bipolar NPN transistor 100 having a large emitter contact area, while minimizing the ratio of the emitter contact area to the base area, as illustrated in FIGS. 2A and 2B, (wherein FIG. 2A is a top view of the transistor 100 and FIG. 2B is a cross-sectional view of the transistor 100 taken along line 2B).

The transistor 100 comprises an isolation trench 111, a P+ substrate 112, an N+ subcollector 114, an N− collector 116 and a P+ base 118. The transistor 100 further includes a collector contact 120 formed within the N+ subcollector 114.

Within the P+ base 118, an emitter contact 122 and a base contact 124 are formed. The base contact 124 is a point contact, and the emitter contact 122 forms a ring around the base contact 124. By providing the emitter contact 122 in the form of a ring surrounding the base contact 124, the size of the emitter contact 122 is enlarged, thereby allowing the transistor 100 to accommodate a higher current, while maintaining a low emitter contact 122 area to base 118 area ratio.

Because the area of the P+ base 118 is kept to a minimum, the P-N junction 117 between the P+ base 118 and the N− collector 116 is likewise minimized. Capacitance is lowered as the area of the P-N junction 117 is lowered. Therefore, by making the P+ base 118 to N− collector 116 P-N junction 117 as small as possible the transistor 100 exhibits a low base capacitance, which tends to enhance the switching speed of the transistor 100.

Next, the base contact 124, the emitter contact 122 and the collector contact 120 of the transistor 100 are wired in order for current to flow from the transistor 100 to adjacent devices and/or the outside world. The amount of current a wire can safely carry from a contact to another device is determined by the size of the wire. As the amount of current being transmitted from the transistor increases, so too must the size of the wires increase.

Conventionally, this needed increase in wire size was accomplished by increasing the width of the wires (in the direction of the y-axis). This, however, defeats the purpose of the first embodiment of the present invention, namely, producing a transistor capable of carrying a high current while maintaining a small overall device size. If the width of the wires was increased to accommodate the higher current therethrough, the base contact 124 and the emitter contact 122 would have to be spread further apart to make room for the wider wires. This would necessitate an increase in the overall size of the transistor 100.

Moreover, utilizing wires that are too small to safely carry the higher currents may result in a phenomenon referred to as "electromigration." In particular, the particles that make up the wire are pulled in the direction of current flow. This results in the displacement of wire particles along the length of the wire, such that voids are created upstream and the wire becomes thicker downstream of the current flow. As a result, the wire is susceptible to failure.

Figure 3A:
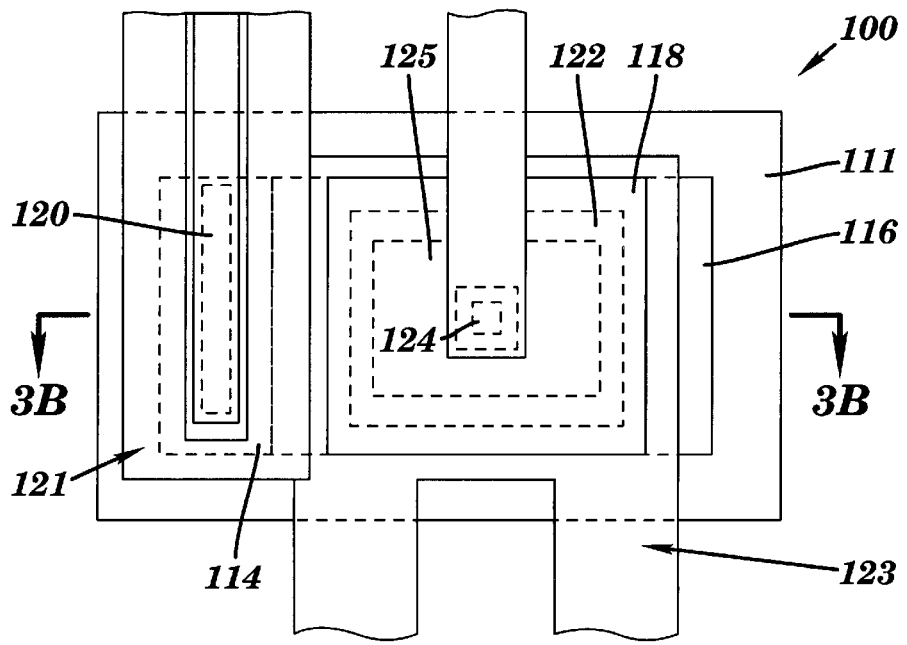
FIG. 3A depicts a top view of the transistor of FIG. 2A having stacked wiring connected thereto in accordance with a second embodiment of the present invention.
Figure 3B:
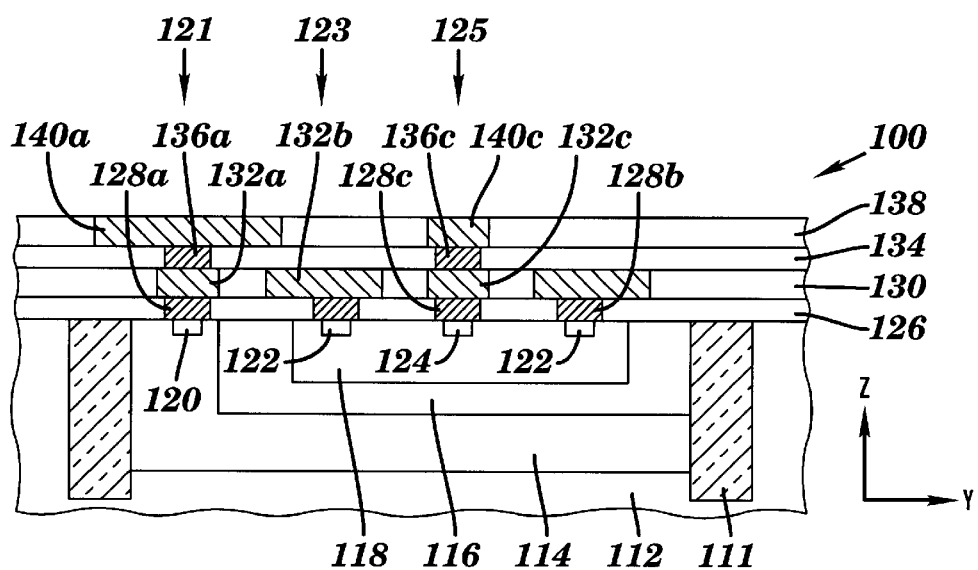
FIG. 3B depicts a cross-section view of the transistor of FIG. 3A in accordance with a second embodiment of the present invention.

Accordingly, a second embodiment of the present invention provides a method of wiring the transistor 100 that safely accommodates a higher current flow, and reduces the electromigration problem. In particular, FIG. 3A shows a top view of the transistor 100 of FIGS. 2A and 2B having wires extending from the base contact 124, the emitter contact 122 and the collector contact 120, and FIG. 3B shows a cross-sectional view of FIG. 3A taken along line 3B.

As illustrated, the wiring forms a vertical stack atop each contact 124, 122, 120, in order to increase the size (in this case the thickness in the direction of the z-axis) of the wires without increasing the overall foot print of the transistor 100. For example, the collector contact 120 has a collector contact stack 121 thereover, comprising a contact 128a, a first wiring level 132a, a via 136a, and a second wiring level 140a. The emitter contact 122 has an emitter contact stack 123 formed thereover, comprising a contact 128b, and a first wiring level 132b. Likewise, the base contact 124 has a base contact stack 125, comprising a contact 128c, a first wiring level 132c, a via 136c, and a second wiring level 140c.

The stacks 121, 123, 125, are typically formed using known damascene techniques. Specifically, a first dielectric layer 126, such as oxide, SiO$_2$, silicon nitride, polyimimdes, etc., is deposited over the surface of the transistor 100, using conventional deposition techniques. Holes are then etched, using known techniques, within the first dielectric layer 126 atop the collector, emitter and base contacts 120, 122, 124. A conductive material, such as tungsten or other similar material, is deposited over the first dielectric layer 126 to fill the holes formed therein. The surface of the first dielectric layer 126 is then planarized, using chemical-mechanical polishing (CMP), or other similar technique, to form contacts 128a, 128b, 128c.

A second dielectric layer 130 is then deposited over the first dielectric layer 126 and the contacts 128a–c. Holes are etched within the second dielectric layer 130 over each contact 128a–c. A conductive material, such as aluminum, copper, or other similar material, is deposited over the second dielectric layer 130 to fill the holes formed therein. The surface of the second dielectric layer 130 is then planarized to form a first wiring level 132a, 132b, 132c of each individual stack 121, 123, 125.

A third dielectric layer 134 is deposited over the second dielectric layer 130 and the first wiring level 132a–c. Holes are etched within the third dielectric layer 134 over the first wiring level 132a, 132c, of the collector contact 120 and the base contact 124, respectively. A conductive material, such as tungsten or other similar material, is deposited over the third dielectric layer 134 to fill the holes formed therein. The surface of the third dielectric layer 134 is then planarized to form vias 136a and 136c therein.

A fourth dielectric layer 138 is deposited over the third dielectric layer 134 and the vias 136a and 136c. Holes are etched within the fourth dielectric layer 138 over the vias 136a, 136c. A conductive material, such as aluminum, copper, or other similar material, is deposited over the fourth dielectric layer 138 to fill the holes formed therein. The surface of the fourth dielectric layer 138 is then planarized to form a second wiring level 140a and 140c for the collector contact stack 121 and the base contact stack 125 therein.

The wiring stacks 121, 123, 125 provide the transistor 100 with an increased current capacity without the typical electromigration problems described above, namely because of the increased wire thickness in the z direction. This is particularly true for the emitter contact stack 123 because the emitter contact 122 typically exhibits the greatest electromigration problems due to the high current passing therethrough. In fact, the second wiring level 140c of the base contact stack 125 is referred to as a "redundant contact" because the second wiring level 140 is only needed to raise the base contact 124 above the emitter contact 122 wiring (in this example, the first wiring level 132). The current running through the base contact 124 is much lower than that of the emitter contact 122, therefore, the base contact 124 has few problems with electromigration, and has little need for the added wiring thickness produced by the vertical stacks. However, because the emitter contact 122, and the wiring connected thereto, forms a ring around the base contact 124, the additional wiring level is needed to allow the base contact 124 to extend above the emitter contact stack 123 and make connection with an adjacent device.

Figure 4A:
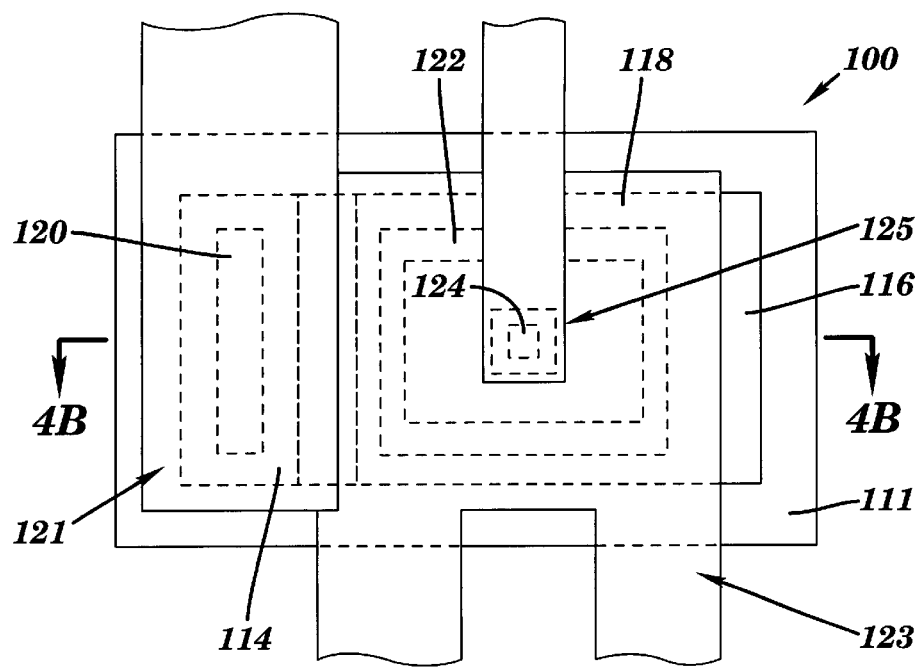
FIG. 4A depicts a cross-sectional view of the transistor of FIG. 3A in accordance with a third embodiment of the present invention.
Figure 4B:
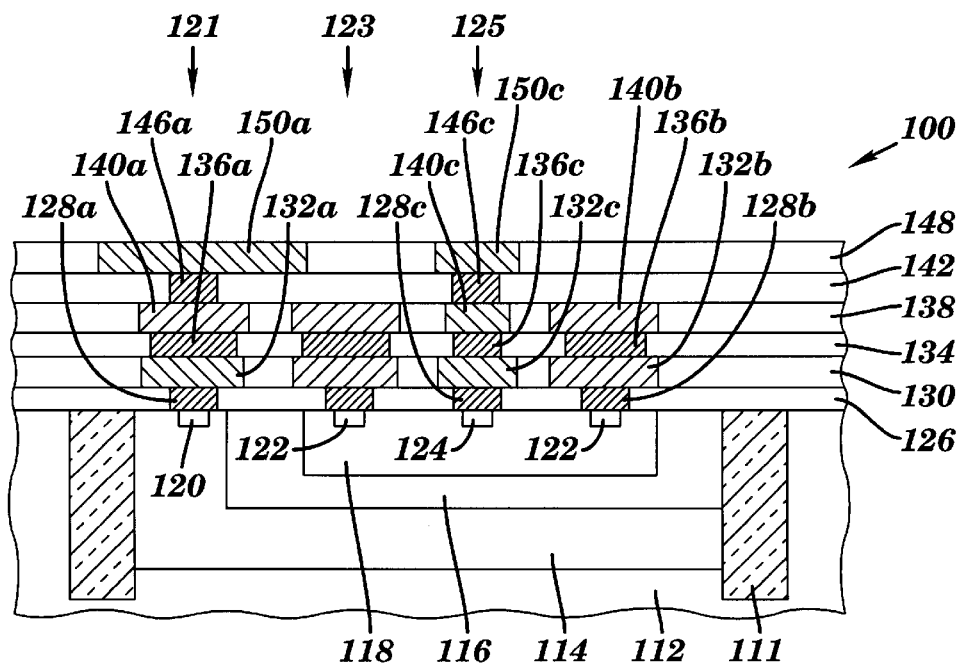
FIG. 4B depicts a cross-sectional view of the transistor of FIG. 4A in accordance with a third embodiment of the present invention.

FIGS. 4A and 4B illustrate a third embodiment, wherein additional wiring levels may be formed for devices needing to accommodate an even higher current. FIG. 4A shows a top view of the transistor 100 having three wiring levels, rather than just two wiring levels, and FIG. 4B shows a cross-sectional view of FIG. 4A taken along line 4B. In contrast to the transistor 100 illustrated in FIG. 3B, the transistor 100 in FIG. 4B has vias 136*a*, 136*b*, 136*c* formed within the third dielectric layer 134 above each contact 128*a*–*c*, rather than just above the contacts 128*a*, 128*c* of the collector and base contacts 120, 124. Likewise, the second wiring level 140*a*–*c* is formed within the fourth dielectric layer 138 above each contact 128*a*–*c*, rather than just over the contacts 128*a*, 128*c* of the collector and base contacts 120, 124.

Thereafter, a fifth dielectric layer 142 is deposited over the fourth dielectric layer 138 and the second wiring layer 140*a*–*c*, using known techniques. Holes are etched within the fifth dielectric layer 142 above the collector contact 120 and the base contact 124. A conductive material, such as tungsten, or other similar material, is deposited over the fifth dielectric layer 142 to fill the holes formed therein. The surface of the fifth dielectric layer 142 is then planarized to form second vias 146*a* and 146*c* therein.

A sixth dielectric layer 148 is then deposited, using known techniques, over the fifth dielectric layer 142 and the second vias 146*a* and 146*c*. Holes are etched within the sixth dielectric layer 148 above the second vias 146*a* and 146*c*. A conductive material, such as aluminum, copper, or other similar material, is deposited over the sixth dielectric layer 148 to fill the holes formed therein. The surface of the sixth dielectric layer 148 is then planarized to form a third wiring level 150*a* and 150*c* of the collector contact stack 121 and the base contact stack 125.

As mentioned above, due to the increased wire thickness in the z direction of the wiring stacks 121, 123, 125, the transistor 100 can accommodate an increased current without the typical electromigration problems, and the additional wiring level used to connect the base contact 124 to an adjacent device, (in the previous example, the second wiring level 140*c*, and in this example, the third wiring level 150*c*), is referred to as a redundant contact.

It should be noted that the via 136*b* above the emitter contact 122, (FIG. 4), may be formed of a single continuous via 136*b* that covers the entire emitter contact 122 ring. In the alternative, the via 136*b* above the emitter contact 122 may be formed of individual vias. For instance, some via formation techniques limit the size of vias formed to 1 micron×1 micron, or 0.8 microns×0.8 microns, etc. If such a technique were used the emitter contact via 136*b* may be formed of a plurality of adjacently placed individual vias.

It should also be noted that the contacts 128*a*–*c* and the vias 136*a*–*c*, 146*a*,*c* (over all the contacts 124, 122, 120), add to the total thickness of the wiring. In other words, the wiring stacks 121, 123, 125 are even thicker because the contacts 128 and the vias 136, 146 that connect the contacts 120, 122, 124 to the respective wiring levels also comprise conductive material that carries current therethrough.

Figure 5:
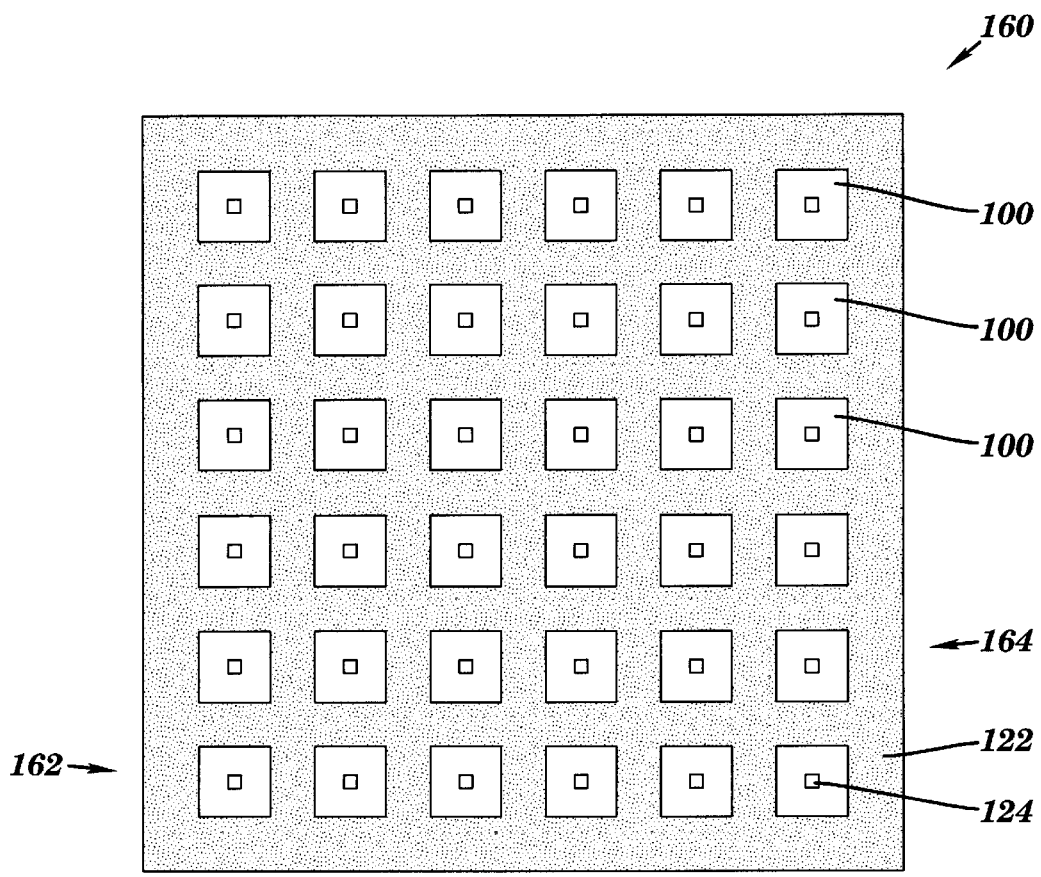
FIG. 5 depicts a top view of a grid device in accordance with a fourth embodiment of the present invention.

In accordance with a fourth embodiment of the present invention, a "grid" device 160 may be formed by placing or abutting at least two or more transistors 100 together. For example, FIG. 5 illustrates a top view of a grid device 160 having 24 transistors 100 connected together. The wiring levels are removed for ease of viewing. In particular, the ring emitter contact 124 of each transistor 100 shares one side of the emitter contact 124 with each adjacent transistor 100 it contacts or abuts. As a result, the current capacity of the overall device 160 almost doubles with the addition of the first transistor 100, and so on with the addition of each transistor 100. (The current capacity is some value less than two times the current capacity of a single transistor 100 because the emitter contact 124 of the first and second transistors 100 share one side, and so on with each additional transistor 100.)

The wiring extending from one side of the grid device 160 is used for current input into the device 160. Since all the transistors 100 are tied together in series, the current tends to drop as it travels from the near side 162 of the device 160 to the far side 164 of the device 160. Ideally, it is desirable to have the emitter contact 122 of every transistor 100 exposed to an equal amount of current.

Therefore, in accordance with a fourth embodiment of the present invention, the grid device 160 may be "de-biased" by adding more resistance to the near side 162 of the device 160 and progressively less resistance toward to the far side 164 of the device 160. This effectively equalizes the amount of resistance across the device 160, such that each emitter contact 124 within the device handles an approximately equal amount of current.

Figure 6:
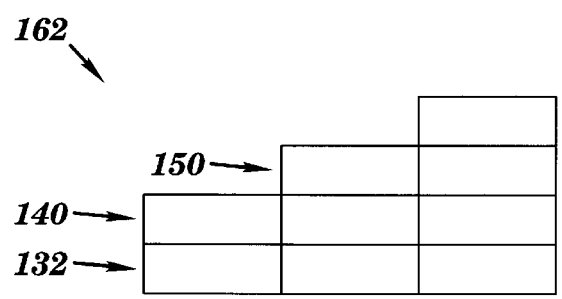
FIG. 6 depicts a cross-sectional view of transistor wiring stacks having variable wiring levels in accordance with a fifth embodiment of the present invention.

This is accomplished in accordance with a fifth embodiment of the present invention by utilizing transistors having various stacked wiring levels. For instance, as illustrated in FIG. 6 which shows the wiring levels of the device 160, the row of transistor 100 located at the near side 162 of the device 160 have two wiring levels 132, 140 (as illustrated in FIGS. 3A and 3B), the next row of transistors 100 have three wiring levels 132, 140, 150 (as illustrated in FIGS. 4A and 4B), the next row of transistors 100 have four wiring levels, and so on until the far side 164 of the device 160 is reached. This is effective because the thinner the metal wire, the more resistance therein, and conversely the thicker the metal wire, the less resistance therein.

It should be noted that the grid device 160 illustrated in FIG. 5 is intended only as an example, and is not intended to limit the present in any manner. For instance, the grid device 160 may comprise any number of transistors 100 and may be arranged in a variety of shapes, i.e., in the form of a T, a rectangle, a ring, etc. Similarly, the de-biasing embodiment illustrated in FIG. 6 is intended as an example only. The wiring stack could alternatively increase from a first corner of the device 160 to an opposing corner of the device 160, etc. Similarly, the number wiring levels within each wiring stack may be varied as desired and needed.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

We claim:

1. A bipolar transistor comprising:
   a base;
   a base contact formed within the base; and
   an emitter contact formed within the base, wherein the emitter contact surrounds the base contact, and a collector contact formed within a subcollector, said collector contact being disposed principally on a single side of said base.

2. The bipolar transistor of claim 1, wherein the emitter contact forms a ring around the base contact.

3. The bipolar transistor of claim 1, wherein the base contact is a point contact.

4. The bipolar transistor of claim 1 wherein wires of the base contact and wires of the emitter contact are vertically stacked atop the base contact and emitter contact, respectively.

5. The bipolar transistor of claim 4, wherein wires of the base contact are stacked at a level higher than the wires of the emitter contact.

6. The bipolar transistor of claim 1, wherein wires of the collector contact are stacked higher than wires of the emitter contact.

7. A bipolar transistor, comprising
a base formed in a substrate, the base abutting an isolation structure formed in the substrate;
a base contact formed within the base;
an emitter contact formed within the base and at least partially surrounding the base contact; and
a collector disposed below the base and abutting the isolation structure.

8. The bipolar transistor of claim 7, further comprising:
a subcollector disposed below the collector and abutting the isolation structure.

9. The bipolar transistor of claim 8, wherein said subcollector has a contact disposed principally on a single side of said base.

10. The bipolar transistor of claim 7, wherein wires of the base contact are stacked higher than wires of the emitter contact.

11. A device comprising:
a base;
a base contact formed within the base; and
an emitter contact formed within the base, wherein the emitter contact extends around at lease two sides of the base contact wherein the wires of the base contact are stacked at a level higher than the wires of the emitter contact.

12. The device of claim 11, wherein the emitter contact surrounds the base contact.

13. The device of claim 11, wherein the emitter contact forms a ring around the base contact.

14. The device of claim 11, wherein the base contact is a point contact.

15. The device of claim 11 further comprising a collector contact formed within a subcollector.

16. The device of claim 15, wherein wires of the collector contact are stacked higher than wires of the emitter contact.

17. The device of claim 11, wherein wires of the base contact and wires of the emitter contact are vertically stacked atop the base contact and emitter contact respectively.

* * * * *